US008896732B2

(12) United States Patent
Sa et al.

(10) Patent No.: US 8,896,732 B2
(45) Date of Patent: Nov. 25, 2014

(54) PIXEL FOR PROCESSING SIGNALS HAVING VISIBLE BAND AND IR BAND, MANUFACTURING METHOD THEREOF, AND PIXEL ARRAY AND IMAGE SENSOR INCLUDING THE SAME

(75) Inventors: Seung Hoon Sa, Seoul (KR); Jung Chan Kyoung, Seoul (KR); Dong Gyu Lee, Seoul (KR); Jong Min You, Seoul (KR); Hyun Jong Ji, Seoul (KR); Jung Wan Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 372 days.

(21) Appl. No.: 13/097,884

(22) Filed: Apr. 29, 2011

(65) Prior Publication Data

US 2012/0257090 A1 Oct. 11, 2012

(30) Foreign Application Priority Data

Apr. 11, 2011 (KR) ........................ 10-2011-0033469

(51) Int. Cl.

*H04N 3/14* (2006.01)
*G02B 5/20* (2006.01)
*H01L 27/146* (2006.01)
*H04N 9/083* (2006.01)

(52) U.S. Cl.

CPC .......... *G02B 5/201* (2013.01); *H01L 27/14621* (2013.01)
USPC ............................ 348/275; 348/273; 348/279

(58) Field of Classification Search

USPC .................................................. 348/273, 275
See application file for complete search history.

(56) References Cited

U.S. PATENT DOCUMENTS 5,552,253 A * 9/1996 Kovacs et al. ................ 430/57.3
7,154,157 B2 * 12/2006 Bradski et al. ................ 257/440
7,633,071 B2 * 12/2009 Eustergerling et al. ..... 250/458.1
7,794,394 B2 * 9/2010 Frangioni ..................... 600/160
7,915,652 B2 * 3/2011 Lee et al. ...................... 257/291
8,287,169 B2 * 10/2012 Yang et al. .................... 362/607
8,350,217 B2 * 1/2013 Sa et al. ........................ 250/349
8,408,821 B2 * 4/2013 Wu et al. ........................ 396/439
8,436,308 B2 * 5/2013 Choe et al. ............... 250/339.05
8,451,241 B2 * 5/2013 Kim et al. ..................... 345/173
8,766,190 B2 * 7/2014 Sa ............................. 250/338.4
2007/0272836 A1 11/2007 Higashitsutsumi et al.
2009/0135167 A1 * 5/2009 Sakai et al. ................... 345/207

FOREIGN PATENT DOCUMENTS

KR 10-2007-0111379 A 11/2007

OTHER PUBLICATIONS

Office Action dated Apr. 25, 2012 in Korean Application No. 10-2011-0033469, filed Apr. 11, 2011.

* cited by examiner

*Primary Examiner* — Ngoc-Yen Vu
(74) *Attorney, Agent, or Firm* — Saliwanchik, Lloyd & Eisenschenk

(57) ABSTRACT

Disclosed are a pixel, a pixel array, a method for manufacturing the pixel array, and an image sensor including the pixel array. The pixel includes a first color filter layer to transmit a visible light and an IR, and a second color filter layer to transmit a light, in which the visible light is blocked, at one side of the first color filter layer.

13 Claims, 6 Drawing Sheets

PIXEL FOR PROCESSING SIGNALS HAVING VISIBLE BAND AND IR BAND, MANUFACTURING METHOD THEREOF, AND PIXEL ARRAY AND IMAGE SENSOR INCLUDING THE SAME

CROSS-REFERENCE TO RELATED APPLICATION

This application claims the benefit under 35 U.S.C. §119 of Korean Patent Application No. 10-2011-0033469, filed on Apr. 11, 2011, which is hereby incorporated by reference in its entirety.

BACKGROUND

The embodiment relates to a pixel, a pixel array, a method for manufacturing the pixel array, and an image sensor including the pixel array.

An image sensor is a photoelectric conversion device to realize an image by using lights.

Meanwhile, in the case of a present image sensor including a silicon substrate, since lights having both of a visible band and an IR band are absorbed, mixed image signals are produced so that it is difficult to precisely process the images.

According to the related art, in order to precisely process the image, an IR cut filter has been used to transmit only lights having a visible band onto pixels while blocking lights having an IR band. However, the IR cut filter must be separately provided as a component of a camera module.

In addition, according to the related art, there is a scheme to use only RGB signals having the visible band or the IR band by providing a predetermined layer capable of transmitting only lights having the IR band around RGB color filter layers. However, a process of forming the layer transmitting lights having only the IR band may not be suitable for a current semiconductor manufacturing process.

In addition, according to the related art, there is a scheme to classify the mixed signal output from RGB pixels into visible band image signals and IR band image signals after supplying lights having the visible band and the IR band to the image sensor. However, since a complex function of an image signal processor must be used, the improvement of the above scheme is required.

BRIEF SUMMARY

The embodiment provides a pixel, a pixel array, a method for manufacturing the pixel array, and an image sensor including the pixel array, capable of independently processing signals having a visible band and an IR band in a simple manner.

According to the embodiment, there is provided a pixel including a first color filter layer to transmit a visible light and an IR, and a second color filter layer to transmit lights, in which a visible light is blocked, at one side of the first color filter layer.

According to the embodiment, there is provided the pixel array including the pixel provided in a form of an array.

According to the embodiment, there is provided a method for manufacturing the pixel array. The method includes forming a first color filter layer to transmit a visible light and an IR, and forming a second color filter layer, which transmits lights in which a visible light is blocked, at one side of the first color filter layer.

According to the embodiment, there is provided an image sensor including a photo-sensing unit and a color filter layer for a pixel on the photo-sensing unit. The color filter layer includes a first color filter layer to transmit a visible light and an IR and a second color filter layer to transmit lights in which a visible light is blocked.

As described above, the embodiment can provide the pixel, the pixel array, the method for manufacturing the pixel array, and the image sensor including the pixel array, in which signals having a visible band and an IR band can be independently processed.

For example, according to the embodiment, an IR cut filter used in a related art is not required. Both of a pixel, in which lights without a visible component can be signal-processed by stacking color filter layers, and a pixel, in which both of visible lights and lights having an IR band can be processed, are provided, thereby providing the pixel, the pixel array, the method for manufacturing the pixel array, and the image sensor including the pixel array, capable of independently processing signals of a visible band and an IR band.

In addition, the embodiment can be applied to application ranges from an image processing application field using only lights having a visible band to an NIR IR sensing application field.

DETAILED DESCRIPTION

Figure 1:
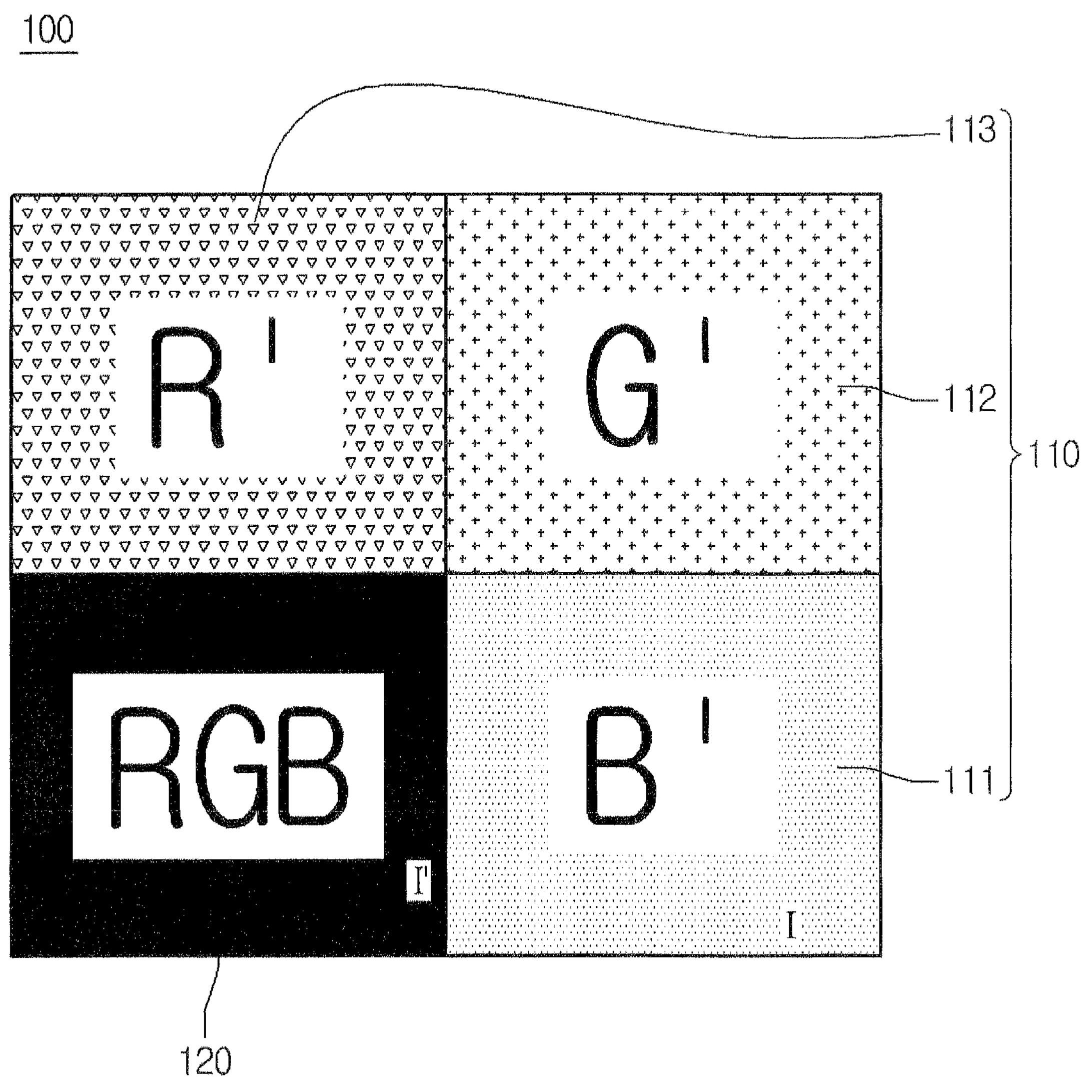
FIG. 1 is a plan view showing a color filter layer of a pixel array according to the embodiment.

In the description of the embodiments, it will be understood that, when a layer (or film), a region, a pattern, or a structure is referred to as being “on” or “under” another substrate, another layer (or film), another region, another pad, or another pattern, it can be “directly” or “indirectly” on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
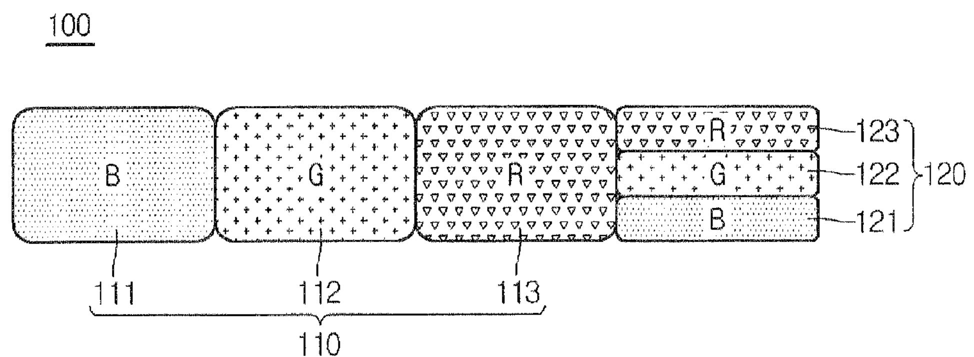
FIG. 2 is a sectional view showing the color filter layer of the pixel array according to the embodiment.

FIG. 1 is a plan view showing a color filter layer in a pixel array according to the embodiment, and FIG. 2 is a sectional view taken along line I-I' in the pixel array according to the embodiment.

A pixel and a pixel array according to the embodiment may include a first color filter layer 110 to transmit a visible light and an IR and a second color filter layer 120 to transmit lights in which a visible light is blocked.

In addition, an image sensor according to the embodiment may include a photo-sensing unit (not shown) and a color filter layer 100 provided above the photo-sensing unit, and the color filter layer 100 may include the first color filter layer 110 to transmit the visible light and the IR and the second color filter layer 120 to transmit lights in which a visible light is blocked.

In addition, in the image sensor according to the embodiment including the photo-sensing unit (not shown) and the color filter layer 100 provided above the photo-sensing unit, the color filter layer 100 may include a first pixel color filter layer 111 for a first color, a second pixel color filter layer 112 for a second color provided at one side of the first pixel color filter layer 111, a third pixel color filter layer 113 for a third color provided at one side of the second pixel color filter layer 112, and a second color filter layer 120 provided at one side of the third pixel color filter layer 113 and having a stack structure of a fourth pixel color filter layer 121 for the first color, a fourth pixel color filter layer 122 for the second color, and a fourth pixel color filter layer 123 for the third color.

The embodiment provides a pixel, a pixel array, a method for manufacturing the pixel array, and an image sensor including the pixel array, capable of independently processing signals having a visible band and an IR band in a simple manner.

For example, according to the embodiment, in order to expand application ranges from an image processing application field using only lights having a visible band to an NIR IR sensing application field, an IR cut filter used in related arts is not required. Both of a pixel, in which lights without a visible component can be signal-processed by stacking color filter layers, and a pixel, in which both of visible lights and lights having an IR band can be processed, are provided, thereby providing the pixel, the pixel array, the method for manufacturing the pixel array, and the image sensor including the pixel array, capable of independently processing signals having a visible band and an IR band in a simple manner.

Figure 3:
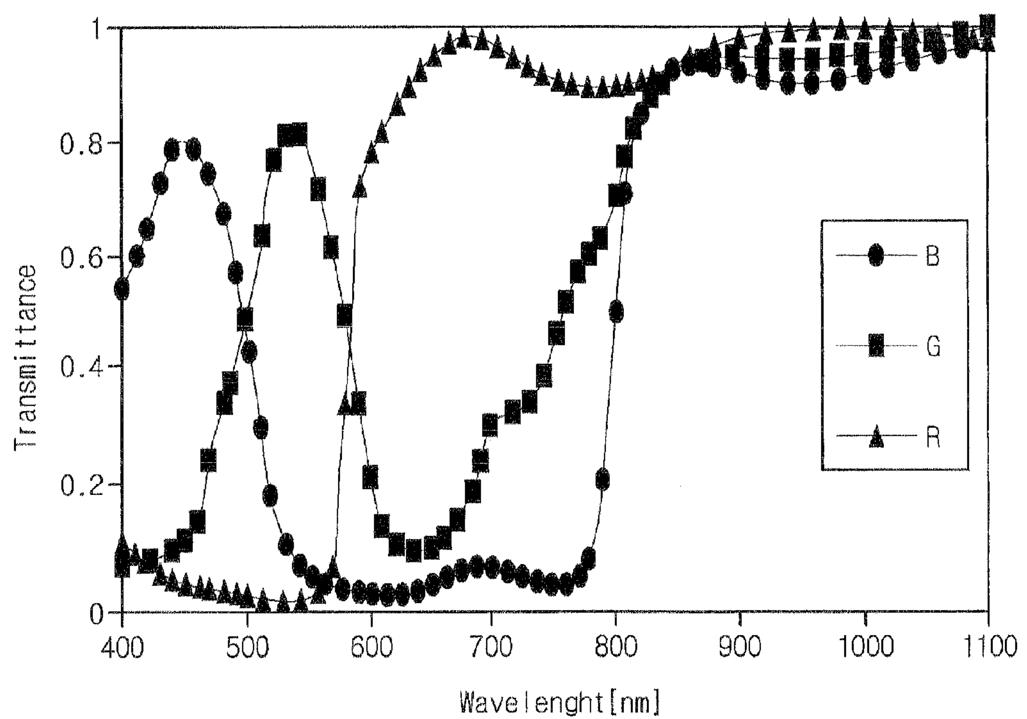
FIG. 3 is a graph showing the characteristics of color filters representing the transmittance of lights having the visible band and an NIR (near infrared ray) IR band.

FIG. 3 is a graph showing color filter characteristics representing the transmittance of lights having a visible band and an NIR IR band.

For example, a blue color represents high light transmittance in a visible band around a wavelength of about 450 nm and an NIR IR band of a wavelength of at least 800 nm. A green color represents high light transmittance in a visible band around a wavelength of about 530 nm and the NIR IR band of a wavelength of at least 800 nm. A red color represents high light transmittance in a visible band around a wavelength of about 600 nm and the NIR IR band of a wavelength of at least 800 nm.

FIGS. 4A to 4D are views showing pixel response according lights in the color filters of the pixel array according to the embodiment.

According to the embodiment, the first pixel color filter layer 111, the second pixel color filter layer 112, and the third pixel color filter layer 113 may be formed in a single layer.

Figure 4A:
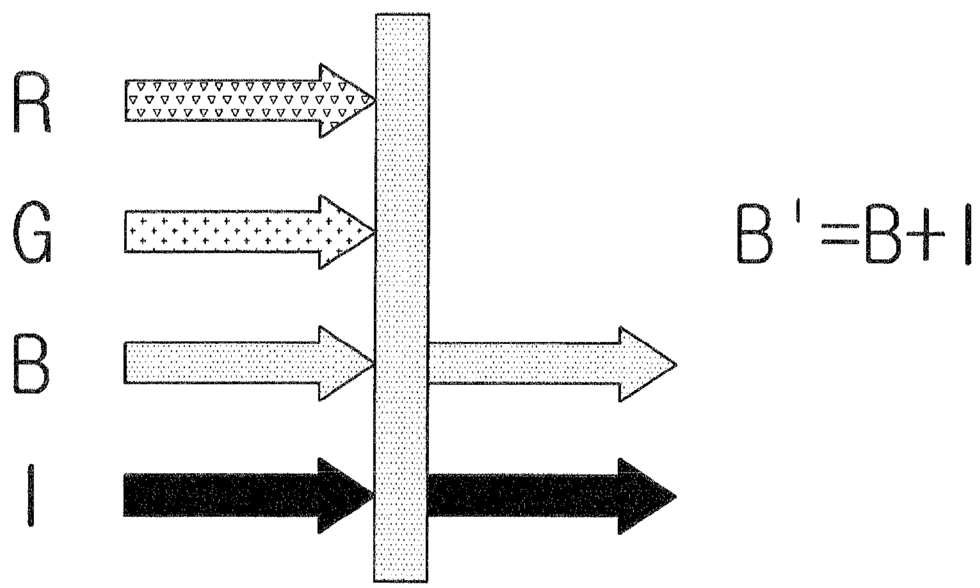
FIGS. 4A to 4D are views showing pixel response of color filter layers according to lights in the pixel array according to the embodiment.

Accordingly, as shown in FIG. 4A, the first pixel color filter layer 111 for the first color, for example, the blue color filter layer 111 transmits lights in a blue region B and an IR region I.

Figure 4B:
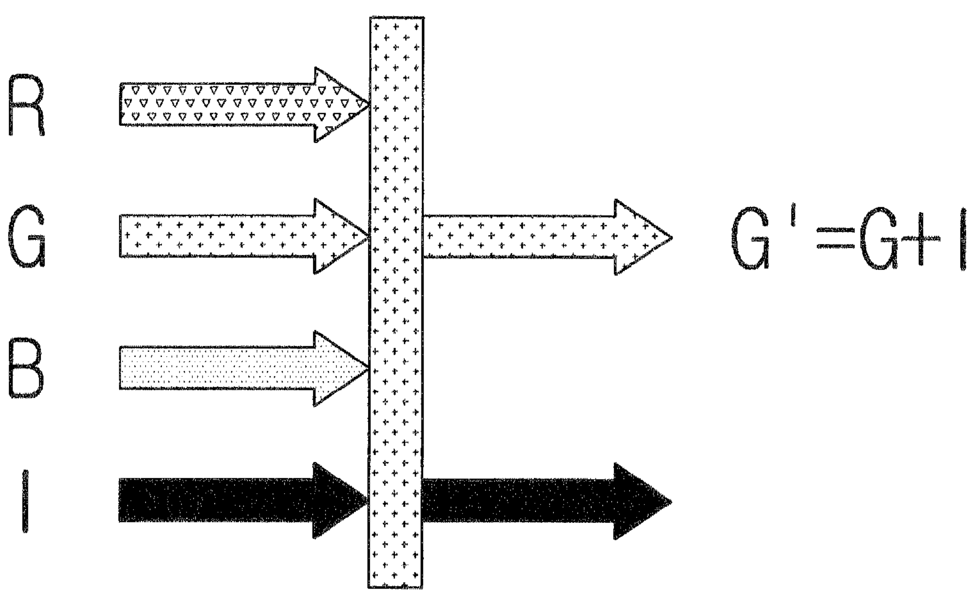

In addition, as shown in FIG. 4B, the second pixel color filter layer 112 for the second color, for example, the green color filter layer 112 transmits lights in a green region G and the IR region I.

Figure 4C:
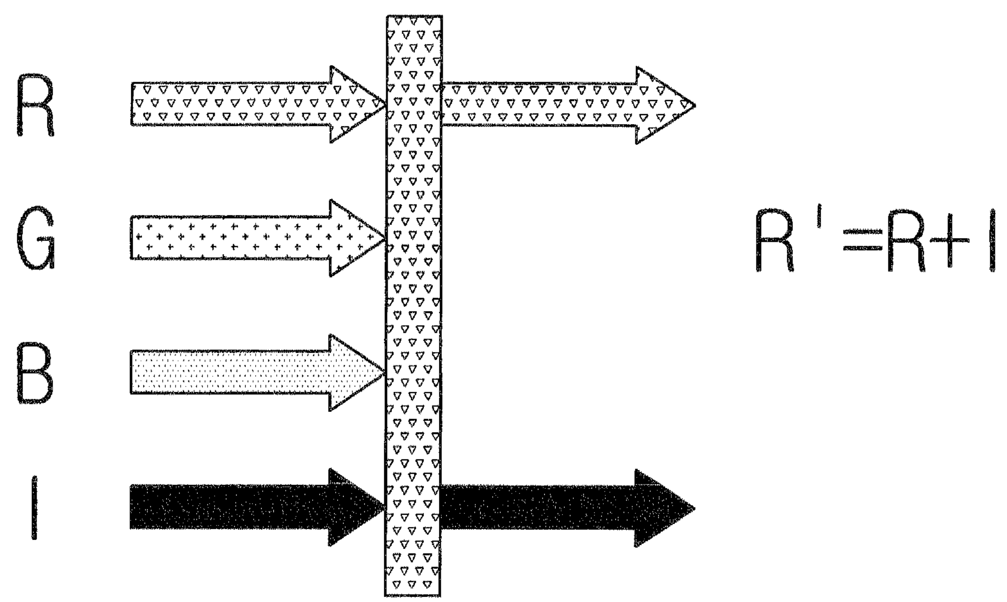

In addition, as shown in FIG. 4C, the third pixel color filter layer 113 for the third color, for example, the red color filter layer 113 transmits lights in a red region R and the IR region I.

Figure 4D:
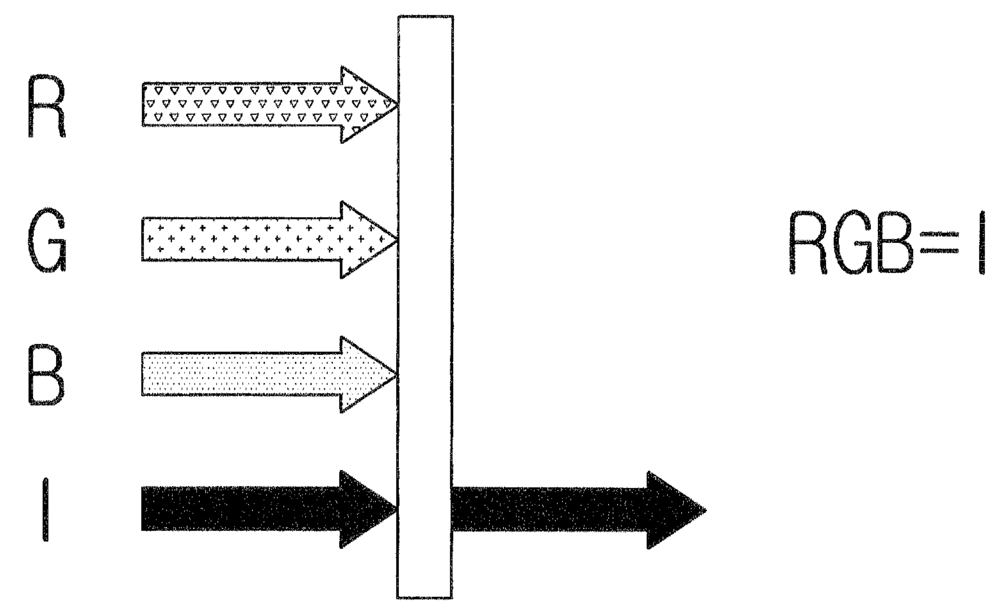

Meanwhile, as shown in FIG. 4D, the fourth pixel color filter layers 121, 122, and 123 for the first, second, and third colors, respectively, absorb all of RGB visible lights and transmit only lights of the NIR IR region I.

For example, a light having the first color, for example, the blue color may be absorbed by the fourth pixel color filter layer 122 for the second color, for example, the green color filter layer. In addition, a light having the first color, for example, the blue color may be absorbed by the fourth pixel color filter layer 123 for the third color, for example, the red pixel color filter layer.

In addition, a light having the second color, for example, the green color may be absorbed by the fourth pixel color filter layer 121 for the first color, for example, the blue pixel color filter layer. In addition, a light having the second color, for example, the green color may be absorbed by the fourth pixel color filter layer 123 for the third color, for example, the red pixel color filter layer.

In addition, a light having the third color, for example, the red color may be absorbed by the fourth pixel color filter layer 121 for the first color, for example, the blue color pixel filter layer. In addition, a light having the third color, for example, the red color may be absorbed by the fourth pixel color filter layer 122 for the second color, for example, the green pixel color filter layer.

Meanwhile, only a light having the NIR IR band can be transmitted through all color filter layers.

Therefore, the first pixel color filter layer 111, the second pixel color filter layer 112, and the third pixel color filter layer 113 for the third color, which have a single color filter layer structure, sense RGB lights having a visible band and an IR. The second color filter layer 120 having a multi-color filter layer structure senses only an IR.

Therefore, according to the embodiment, signals having the visible band can be independently distinguished from the signals having an IR band due to the signal difference between the first pixel color filter layer 111, the second pixel color filter layer 112, and the third pixel color filter layer 113 for the third color, which transmit both a visible light and an IR, and the second color filter layer 120 which transmits lights in which a visible light is blocked. Signal-processing for the signals having the visible band and the signals having the IR band is performed, so that an application range can be expanded from the application field of a visible light to the application field of the NIR IR band.

For example, according to the embodiment, in order to expand application ranges from an image processing application field using only lights having a visible band to an NIR IR sensing application field, an IR cut filter used in related arts is not required. Both of a pixel, in which lights without a visible component can be signal-processed by stacking color filter layers, and a pixel, in which both of visible lights and lights having an IR band can be processed, are provided, thereby providing the pixel, the pixel array, the method for manufacturing the pixel array, and the image sensor including the pixel array, capable of independently processing signals of a visible band and an IR band in a simple manner.

Hereinafter, the method for manufacturing the color filter layers of the pixel array according to the embodiment will be described with reference to FIGS. 5A to 5D.

FIGS. 5A to 5D are views showing a signal layer structure or a multi-layer structure of color filter layers in each pixel, and illustrates the method for manufacturing the color filter layers in the above structure.

Figure 5A:
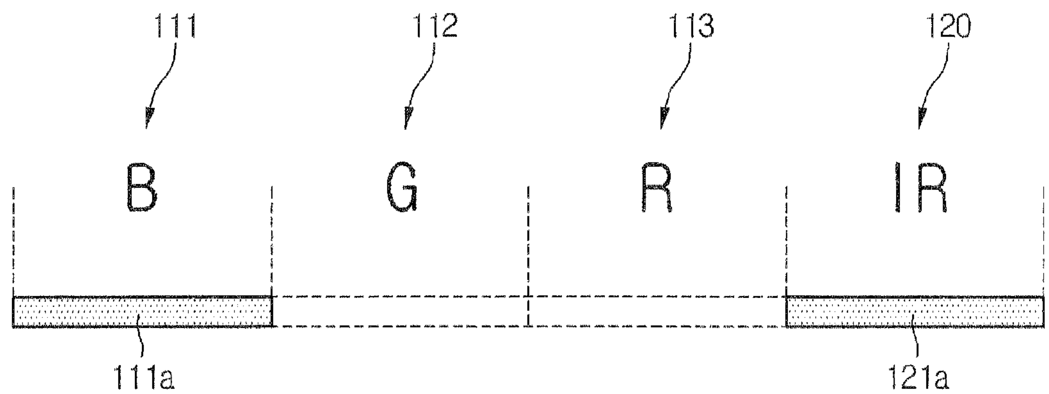
FIGS. 5A to 5D are process sectional views showing a method for manufacturing the color filter layer in the pixel array according to the embodiment.

First, as shown in FIG. 5A, after coating the first pixel color filter layer 111 for the first color having a predetermined thickness, for example, a first pixel color filter layer 111*a* for a blue color, a blue color filter is removed from the other color regions, for example, green and red pixel regions G and R.

Meanwhile, the blue color filter of the IR region is not removed, and a fourth pixel color filter layer 121_a_ for the first color may be formed.

Figure 5B:
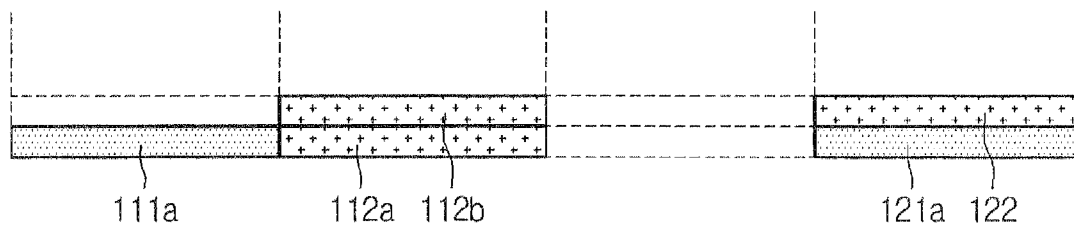

Next, as shown in FIG. 5B, after coating second pixel color filter layers 112_a_ and 112_b_ for the second color having a predetermined thickness, for example, the second pixel color filter layer 112_a_ for a green color, a green color filter is removed from the other color regions, for example, blue and red pixel regions B and R. The second pixel color filter layers 112_a_ and 112_b_ may be formed through a plurality of processes, but the embodiment is not limited thereto. Meanwhile, the green color filter of the IR region is not removed, and the fourth pixel color filter layer 112 for the second color may be formed.

Figure 5C:
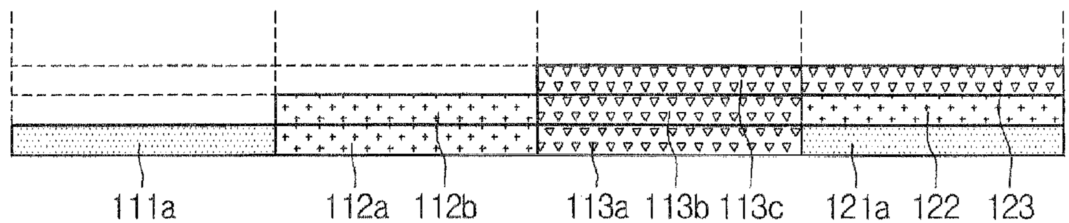

Next, as shown in FIG. 5C, after coating third pixel color filter layers 113_a_, 113_b_, and 113_c_ for the third color having a predetermined thickness, for example, a red color filter layer, the red color filter layer is removed from the blue and green pixel regions B and G. The third pixel color filter layers 113_a_, 113_b_, and 113_c_ may be formed through a plurality of processes, but the embodiment is not limited thereto. Meanwhile, the red color filter of the IR region is not removed, and the fourth pixel color filter layer 123 for the third color can be formed.

Accordingly, color filter layers having a single layer structure may be formed in RGB pixels, and RGB color filters having a stack structure are formed in the pixel of the IR region.

Even if the first, second, and third pixel color filter layers 111, 112, and 113 may be formed through a plurality of processes, several layers formed through the plural processes act as a single layer.

Meanwhile, the second color filter layer 120 has a multi-layer structure which is a stack structure of the fourth pixel color filter layer 121 for the first color, the fourth pixel color filter layer 122 for the second color, and the fourth pixel color filter 123 for the third color.

Figure 5D:
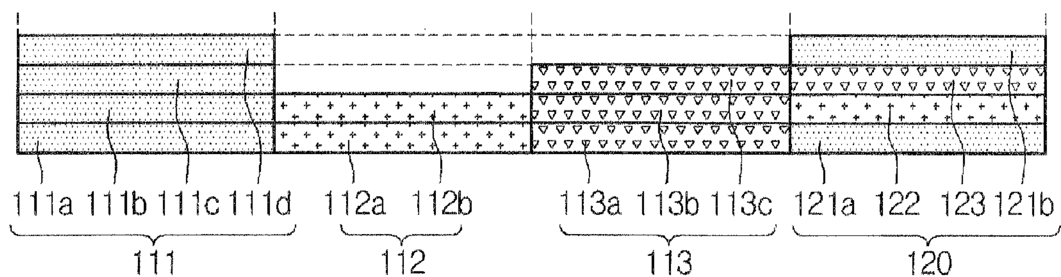

According to the embodiment, as shown in FIG. 5D, when the thickness of each color filter must be adjusted, the above method can be additionally repeated, and each layer is coated at a proper thickness, so that a color filter layer having the optimal thickness can be manufactured. Several layers formed through a plurality of processes act as one single layer.

For example, the first pixel color filter layer 111 may include the first pixel color filter layers 111_a_, 111_b_, 111_c_, and 111_d_, and the second pixel color filter layer 112 may include the second pixel color filter layers 112_a_ and 112_b_. The third pixel color filter layer 113 may include the third pixel color filter layers 113_a_, 113_b_, and 113_c_. The fourth pixel color filter layer 121 for the first color may include a plurality of fourth pixel color filter layers 121_a_ and 121_b_ for the first color, but the embodiment is not limited thereto.

The embodiment can provide the pixel, the pixel array, the method for manufacturing the pixel array, and the image sensor including the pixel array, capable of independently processing signals having a visible band and an IR band in a simple manner.

For example, according to the embodiment, in order to expand application ranges from an image processing application field using only lights having a visible band to an NIR IR sensing application field, an IR cut filter used in related arts is not required. Both of a pixel, in which lights without a visible component can be signal-processed by stacking color filter layers, and a pixel, in which both of visible lights and lights having an IR band can be processed, are provided, thereby providing the pixel, the pixel array, the method for manufacturing the pixel array, and the image sensor including the pixel array, capable of independently processing signals having a visible band and an IR band in a simple manner.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A pixel comprising:

a first color filter layer comprising a first pixel color filter layer for a first color in a first color region, a second pixel color filter layer for a second color in a second color region, and a third pixel color filter layer for a third color in a third color region, wherein the first color filter layer is configured to transmit a signal including a visible light and an IR; and a second color filter layer disposed at one side of the first color filter layer, and comprising the first pixel color filter layer, the second pixel color filter layer on the first pixel color filter layer, and the third pixel color filter layer on the second pixel color filter layer in an IR region, wherein the second color filter layer is configured to transmit a signal including an IR, in which a visible light is blocked, wherein the first color region, the second color region, the third color region, and the IR region are disposed on the same plane;

wherein the pixel is formed by:

forming the first pixel color filter layer in the first color region, the second color region, the third color region, and the IR region;

removing the first pixel color filter layer from the second color region and the third color region;

forming the second pixel color filter layer in the first color region, the second color region, the third color region, and the IR region;

removing the second pixel color filter layer from the first color region and the third color region;

forming the third pixel color filter layer in the first color region, the second color region, the third color region, and the IR region; and removing the third pixel color filter layer from the first color region and the second color region; and wherein the visible light transmitted by the first color filter layer is independently distinguishable from the IR transmitted by the first color filter layer due to a difference between the signal transmitted by the first color filter layer and the signal transmitted by the second color filter layer.

2. The pixel of claim 1, wherein the second color region is disposed at one side of the first color region, and wherein the third color region is disposed at one side of the second color region.

3. The pixel of claim 1, wherein the second pixel color filter layer of the IR region is stacked on the first pixel color filter layer of the IR region, wherein the third pixel color filter layer of the IR region is stacked on the second pixel color filter layer of the IR region, and wherein another first pixel color filter layer of the IR region is stacked on the third pixel color filter layer of the IR region.

4. A pixel array comprising the pixel claimed in claim 1.

5. A pixel array comprising the pixel claimed in claim 2.

6. A pixel array comprising the pixel claimed in claim 3.

7. A method for manufacturing a pixel, the method comprising:

forming a first pixel color filter layer for a first color in a first color region, a second color region, a third color region, and an IR region;

removing the first pixel color filter layer from the second color region and the third color region;

forming a second pixel color filter layer for a second color in the first color region, the second color region, the third color region and the IR region;

removing the second pixel color filter layer from the first color region and the third color region;

forming a third pixel color filter layer for a third color in the first color region, the second color region, the third color region, and the IR region; and removing the third pixel color filter layer from the first color region and the second color region, wherein the first color region, the second color region, the third color region, and the IR region are disposed on the same plane, wherein the first pixel color filter layer of the first color region, the second pixel color filter layer of the second color region, and the third pixel color filter layer of the third color region form a first color filter layer for transmitting a signal including a visible light and an IR, wherein the first pixel color filter layer, the second pixel color filter layer, and the third pixel color filter layer of the IR region form a second filter layer for transmitting a signal including an IR, in which a visible light is blocked;

wherein the visible light transmitted by the first color filter layer is independently distinguishable from the IR transmitted by the first color filter layer due to a difference between the signal transmitted by the first color filter layer and the signal transmitted by the second color filter layer.

8. The method of claim 7, further comprising:

forming another pixel color filter layer in the first color region, the second color region, the third color region, and the IR region; and removing the another pixel color filter layer from the second color region and the third color region.

9. The method of claim 8, wherein the second pixel color filter layer of the IR region is stacked on the first pixel color filter layer of IR region, wherein the third pixel color filter layer of the IR region is stacked on the second pixel color filter layer of the IR region, and wherein the another first pixel color filter layer of the IR region is stacked on the third pixel color filter layer of the IR region.

10. The method of claim 7, wherein the second pixel color filter layer of the IR region is stacked on the first pixel color filter layer of the IR region, and wherein the third pixel color filter layer of the IR region is stacked on the second pixel color filter layer of the IR region.

11. An image sensor comprising:

a photo-sensing unit; and a pixel provided above the photo-sensing unit, wherein the pixel comprises:

a first color filter layer comprising a first pixel color filter layer for a first color in a first color region, a second pixel color filter layer for a second color in a second color region, and a third pixel color filter layer for a third color in a third color region, wherein the first color filter layer is configured to transmit a signal including a visible light and an IR; and a second color filter layer disposed at one side of the first color filter layer, and comprising the first pixel color filter layer, on the second pixel color filter layer on the first pixel color filter layer, and the third pixel color filter layer on the second pixel color filter layer in an IR region, wherein the second color filter layer is configured to transmit a signal including an IR, in which a visible light is blocked, wherein the first color region, the second color region, the third color region, and the IR region are on the same plane;

wherein the pixel is formed by:

forming the first pixel color filter layer in the first color region, the second color region, the third color region, and the IR region;

removing the first pixel color filter layer from the second color region and the third color region;

forming the second pixel color filter layer in the first color region, the second color region, the third color region, and the IR region;

removing the second pixel color filter layer from the first color region and the third color region;

forming the third pixel color filter layer in the first color region, the second color region the third color region, and the IR region; and removing the third pixel color filter layer from the first color region and the second color region; and wherein the visible light transmitted by the first color filter layer is independently distinguishable from the IR transmitted by the first color filter layer due to a difference between the signal transmitted by the first color filter layer and the signal transmitted by the second color filter layer.

12. The image sensor of claim 11, wherein the second color region is disposed at one side of the first color region, and wherein the third color region is disposed at one side of the second color region.

13. The image sensor of claim 11, wherein the second pixel color filter layer of the IR region is stacked on the first pixel color filter layer of the IR region, wherein the third pixel color filter layer of the IR region is stacked on the second pixel color filter layer of the IR region, and wherein another first pixel color filter layer of the IR region is stacked on the third pixel color filter layer of the IR region.

* * * * *